(12) United States Patent
Leong et al.

(10) Patent No.: US 9,331,634 B2
(45) Date of Patent: May 3, 2016

(54) FREQUENCY DOWN-CONVERSION

(71) Applicant: NXP B.V., Eindhoven (NL)

(72) Inventors: Frank Leong, Eindhoven (NL);
Salvatore Drago, Eindhoven (NL)

(73) Assignee: NXP B.V., Eindhoven (NL)

( * ) Notice: Subject to any disclaimer, the term of this patent is extended or adjusted under 35 U.S.C. 154(b) by 41 days.

(21) Appl. No.: 14/449,556

(22) Filed: Aug. 1, 2014

(65) Prior Publication Data

US 2016/0036385 A1 Feb. 4, 2016

(51) Int. Cl.
*H04B 1/26* (2006.01)
*H03D 7/16* (2006.01)
*H03D 7/18* (2006.01)
*H04B 1/16* (2006.01)

(52) U.S. Cl.
CPC ............. *H03D 7/165* (2013.01); *H03D 7/18* (2013.01); *H04B 1/16* (2013.01); *H03D 7/166* (2013.01)

(58) Field of Classification Search
CPC ......... H03D 7/16; H03D 7/165; H03D 7/166; H03D 7/18; H04B 1/26; H04B 1/30
USPC .......................................... 455/302, 313, 323
See application file for complete search history.

(56) References Cited

U.S. PATENT DOCUMENTS

| | | | | |
|---|---|---|---|---|
| 4,551,856 A * | 11/1985 | Victor | .................... | H03J 5/0281 455/165.1 |
| 5,832,375 A * | 11/1998 | Leisten | .................... | G01S 19/32 455/196.1 |
| 6,330,290 B1 * | 12/2001 | Glas | ...................... | H03D 3/009 329/306 |
| 7,130,604 B1 * | 10/2006 | Wong | ....................... | H03D 7/12 455/302 |
| 7,450,185 B2 * | 11/2008 | Wu | ........................ | H04N 5/4446 348/725 |
| 8,768,283 B2 * | 7/2014 | Mu | ........................ | H03D 7/166 455/302 |
| 2002/0160741 A1 * | 10/2002 | Kim | ........................ | H03D 3/009 455/318 |
| 2002/0176528 A1 * | 11/2002 | Roth | ........................ | H04B 1/26 375/376 |
| 2007/0264945 A1 | 11/2007 | Carrez | | |
| 2008/0284487 A1 | 11/2008 | Pullela et al. | | |
| 2012/0008717 A1 | 1/2012 | van Sinderen et al. | | |
| 2012/0142300 A1 * | 6/2012 | Herzinger | ............ | H04B 1/0064 455/293 |
| 2012/0322398 A1 | 12/2012 | Pullela et al. | | |
| 2013/0177113 A1 * | 7/2013 | Sundstrom | ............. | H03D 7/166 375/345 |
| 2013/0183921 A1 * | 7/2013 | Mu | ........................ | H03D 7/166 455/326 |

OTHER PUBLICATIONS

J. van Sinderen et al., "Wideband UHF ISM-Band Transceiver Supporting Multichannel Reception and DSSS Modulation," IEEE ISSCC, 2013.
F. Leong et al., "A 6.5 GHz Arbitrary Digital Waveform Generaotr," IEEE ESSCIRC, 2012.
Extended European Search Report for Patent Appln. No. 15179248.8 (Dec. 18, 2015).

* cited by examiner

*Primary Examiner* — Duc M Nguyen
(74) *Attorney, Agent, or Firm* — Rajeev Madnawat

(57) ABSTRACT

Apparatus and methods concern down-converting a radio frequency (RF) signal. As an example, one apparatus includes a first mixer and a second mixer. The first mixer down-converts an RF signal to produce a first intermediate frequency (IF) signal. The second mixer down-converts the first IF signal to produce a second IF signal having a plurality of phase components. The down-converter also includes a plurality of summing circuits. Each of the summing circuits is configured to combine various ones of the phase components of the second IF signal to produce a respective phase component of a third IF signal. The number of phase components in the third IF signal is different from the number of phase components in the second IF signal.

16 Claims, 4 Drawing Sheets

FREQUENCY DOWN-CONVERSION

Aspects of various embodiments are directed to frequency conversion systems, in particular for use as up-converters or down-converters in radio frequency (RF) receivers or transmitters.

In various RF receiver applications a down-converter may be used to shift a received signal from a higher RF used for transmission to a lower intermediate frequency (IF) for signal processing. A down-converter may include a local oscillator (LO) based circuit configured to generate one or more LO signals and one or more mixers configured to down-convert an input signal according to the LO signals. Each mixer down-converts the input signal by subtracting a frequency of the LO signals from the frequency of the input signal.

For example, a quadrature down-converter typically includes 4 mixers respectively driven by four LO signals (e.g., LO_I+, LO_Q+, LO_I−, and LO_Q−), which have phases separated from each other by 90 degrees. Each mixer samples an input quadrature RF signal at the edges of the LO signals, to produce one phase component of an IF quadrature signal. In some down-converters, the LO signals may be adjusted by a user to set the IF signal produced by the down-converter to a desired frequency. In some implementations, programmable dividers are used to reduce a frequency of an oscillator signal from which the LO signals are generated. Using the programmable dividers, a ratio between the frequency of a high-frequency oscillator signal and the frequency of the LO signals may be configured to multiples of 2 (e.g., 2, 4, 6, 8, 10, 12 . . . ). The ratio is limited to multiples of 2 due to the need to generate the four LO signals with acceptable implementation efficiency.

Various example embodiments are directed to apparatus and method for down-converting RF signals. An apparatus is disclosed for down-converting an RF signal. The apparatus includes a first mixer and a second mixer. The first mixer down-converts an RF signal to produce a first IF signal. The second mixer down-converts the first IF signal to produce a second IF signal having a plurality of phase components. The down-converter also includes a plurality of summing circuits. Each of the summing circuits is configured to combine various ones of phase components of the second IF signal to produce a respective phase component of a third IF signal. The number of phase components in the third IF signal is different from the number of phase components in the second IF signal.

A method is also disclosed for down-converting an RF signal. The RF signal is down-converted to produce a first IF signal having a first number of phase components. The first IF signal is further down-converted to produce a second IF signal having a second number of phase components. Various ones of the phase components of the second IF signal are summed to produce respective phase components of a third IF signal. The third IF signal has a third number of phase components that is different from the second number of phase components.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
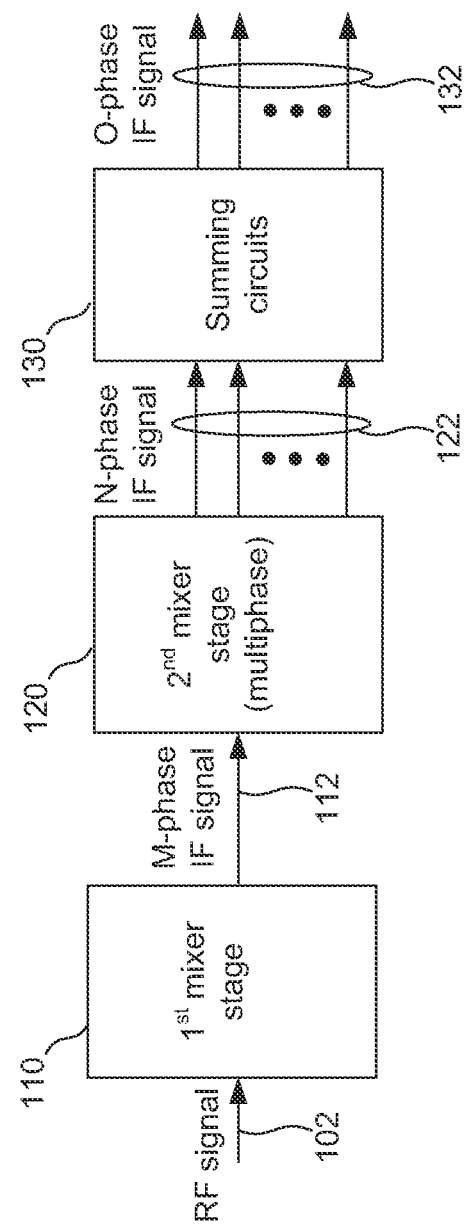
FIG. 1 shows a first down-converter circuit, consistent with one or more embodiments.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving frequency conversion of RF signals. While not necessarily so limited, various aspects may be appreciated through a discussion of examples using this context.

Circuits and method are disclosed for down-conversion of a signal form an RF to an IF. A mixer circuit down-converts an input RF signal into a first IF signal having a first number of phase components. Summing circuits combine various ones of the first number of phase components to produce an IF signal having a desired second number of phase components (e.g., a quadrature phase IF signal). This approach decouples the number of LO signals used by the mixer from the desired number of phase components in the final IF signal. For example, the down-converter may be configured to produce a four phase IF signal without generating four LO signals for the mixer. As such, the ratio between a frequency of a high frequency oscillator signal and a frequency of the LO signals are not necessarily limited to a multiple of 2 and configurability is improved.

In various embodiments, power consumption of the down-converter is reduced by using multiple mixing stages. Ring oscillators and frequency dividers which generate the LO signals for the mixer circuit utilize more power when operated at higher frequencies. In some embodiments, an RF signal is down-converted to a desired frequency using two mixing stages, each down-converting the frequency of the signal by a fraction of the total frequency down-conversion performed by the down-converter. As the down-conversion performed by each of the mixing stages is only a fraction of the total down-conversion, the frequency of the LO signals used by each of the mixing stages is reduced in comparison to LO signals needed for a single stage down-conversion. Thus, local oscillators and frequency dividers that generate the LO signals may be operated at lower frequencies—thereby reducing power consumption of local oscillators and frequency dividers. Although an additional mixing stage is required to perform the multi-stage mixing, the additional mixing stage operates at a lower frequency and consumes less power than that which can be saved by operating the local oscillators and frequency dividers at lower frequencies.

In some embodiments, a down-converter includes a first mixer and a second mixer. The first mixer down-converts an RF signal to produce a first IF signal. The second mixer down-converts the first IF signal to produce a second IF signal having a plurality of phase components. The down-converter also includes a plurality of summing circuits. Each of the summing circuits is configured to combine various phase components of the second IF signal to produce a respective phase component of a third IF signal. The number of phase components in the third IF signal is different from the number of phase components in the second IF signal. The first mixer is configured to subtract a first LO signal from the RF signal to produce the first IF signal. The second mixer is configured to subtract a second LO signal from the first IF signal to produce the second IF signal.

In different implementations, the first and second IF signals provided by the first and second mixers may include various numbers of phase components. In some implementations, the first IF signal is a single-ended signal having a single phase component. In some other implementations, the first IF signal is a differential signal having two phase components that are 180 degrees out of phase. The second mixer is configured to derive a plurality of phase components from each phase component in the first IF signal. For example, in some implementations, the second mixer is configured to derive 3 phase components from each of the phase components in the first IF signal. In some other implementations, the second mixer is configured to derive 5 phase components from each of the phase components in the first IF signal.

In various embodiments, the ratio of the frequency of the first LO signal to the frequency of the second LO signal depends on the number of phase components included in each of the first and second IF signals. The relationship between the frequency ($f_{LO1}$) of the first LO signal (LO1), the frequency ($f_{LO2}$) of the second LO signal (LO2), the frequency ($f_{IF1}$) of the first IF signal, frequency ($f_{IF2}$) of the second IF signal, and the frequency ($f_{RF}$) of the RF signal is given by:

$$f_{LO1}=(N/(M*2))*f_{LO2},$$

$$f_{LO1}=(N/(M*(2+N)))*f_{RF}, \text{ and}$$

$$f_{LO2}=f_{IF1}=2/(2+N)*f_{RF},$$

where M is the number of phased components in the first IF signal and N is the number of phased components in the second IF signal.

Turning now to the Figures, FIG. 1 shows a first down-converter circuit, consistent with one or more embodiments. The down-converter circuit 100 includes a first mixer stage 110 configured to down-convert an RF signal 102 to produce a first IF signal 112 having M phase components. A second mixer stage 120 is configured to further down-convert the first IF signal 112 to produce a multiphase IF signal 122 having N phase components, wherein N>M. The down-converter circuit 100 also includes a set of summing circuits 130 that are configured to combine various phase components of the second IF signal to produce phase components of a third IF signal 132 having a third number O of phase components, where N≠O. In different applications, the third IF signal 132 output by the summing circuits 130 may include various numbers of phase components. While embodiments are not so limited, for ease of explanation, the following examples may be primarily discussed with reference to a set of summing circuits that output a quadrature phase IF signal.

Figure 2:
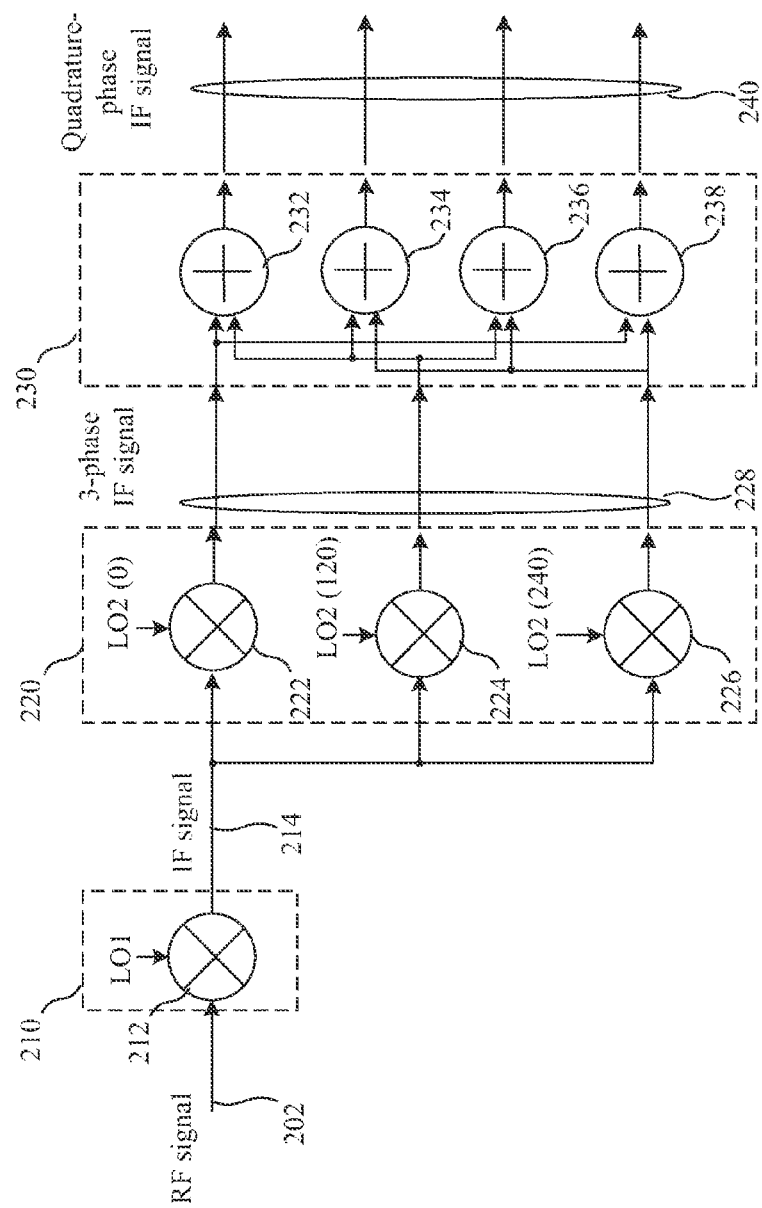
FIG. 2 shows a second down-converter circuit, consistent with one or more embodiments.

FIG. 2 shows a second down-converter circuit, consistent with one or more embodiments. The down-converter circuit 200 includes a first mixer stage 210 configured to down-convert an RF signal 202 to produce a first IF signal 214. In this example, first mixer stage 210 includes one mixer 212 configured to subtract a frequency of a first LO signal (LO1) from a frequency of the RF signal 202 to produce the first IF signal 214. A second mixer stage 220 is configured to further down-convert the first IF signal 214 to produce a second IF signal 228. In this example, the second mixer stage 220 includes three mixers 222, 224, and 226. Each of the mixers 222, 224, and 226 is configured to subtract a frequency of a respective phase component of a second LO signal (LO2) from the first IF signal 214 to produce a respective phase component of the second IF signal 228.

The down-converter circuit 200 also includes a set of summing circuits 230 that are configured to combine various phase components of the second IF signal to produce phase components of a quadrature phase IF signal 240. In this example, the set of summing circuits 230 includes four summing circuits 232, 234, 236, and 238. Each of the summing circuits 232, 234, 236, and 238 is configured to add a respective two of the phase components of the second IF signal 128 to produce a respective phase component of the quadrature phase IF signal 240.

Figure 3:
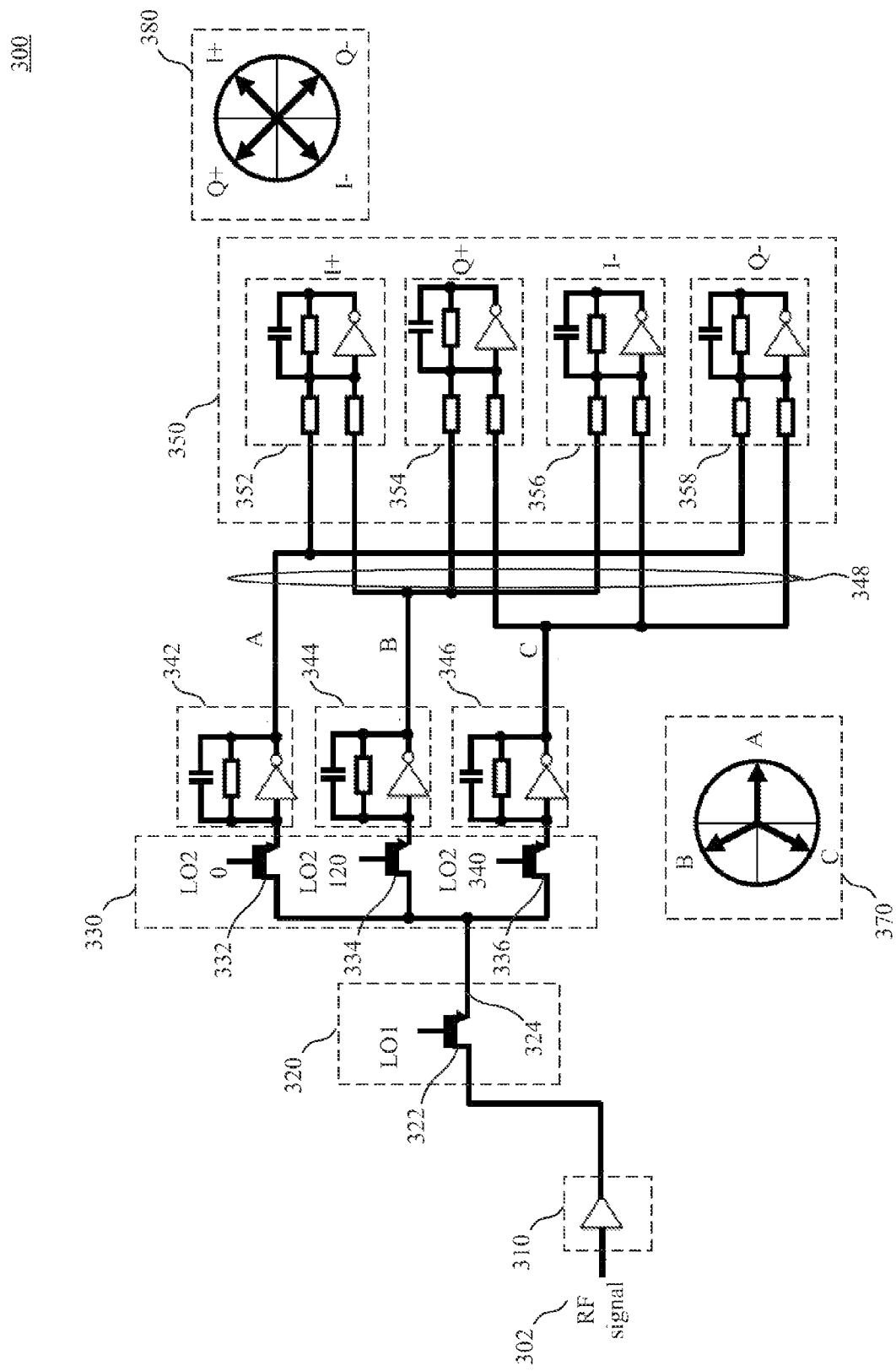
FIG. 3 shows a third down-converter circuit, consistent with one or more embodiments.

FIG. 3 shows a third down-converter circuit, consistent with one or more embodiments. The down-converter circuit 300 includes a first mixer stage 320 configured to down-convert an RF signal 302 to produce a first IF signal 324. In some implementations, down-converter circuit 300 may include an amplifier 310 or filter (not shown) to amplify or process the RF signal 302 provided to the first mixer stage 320.

In this example, first mixer stage 320 includes one mixer 322 configured to subtract a frequency of a first LO signal (LO1) from a frequency of the RF signal to produce the first IF signal 324. A second mixer stage 330 is configured to further down-convert the first IF signal 324 to produce a second IF signal 348 that has three phase components A, B, and C. In this example, the second mixer stage 330 includes three mixers 332, 334, and 336. Each of the mixers 332, 334, and 336 is configured to subtract a frequency of a respective phase component of a second LO signal (LO2) from the first IF signal 324 to produce a respective phase component A, B, or C of the second IF signal 348. The phase component A, B, or C are separated from each other in phase by 120 degrees as shown in the symbol constellation diagram 370. In this example, each of the mixers 322, 332, 334, and 336 is implemented using a switching circuit that is gated by a respective phase component of the LO1 or LO2 signals.

In some implementations, the first or second IF signals may be amplified or filtered by signal processing circuits. In this example, the down-converter circuit 300 includes a set of trans-impedance amplifiers 342, 344, and 346 connected to the second mixing stage 330. Each of the trans-impedance amplifiers 342, 344, and 346 is configured to amplify a respective phase component A, B, or C of the second IF signal 348.

A set of summing circuits 350 is configured to combine phase components of the second IF signal 348 to produce phase components I+, Q+, I−, and Q− of a balanced quadrature phase IF signal. The distribution of the phase components I+, Q+, I−, and Q− is shown in phase constellation chart 380. The set of summing circuits 350 includes four summing trans-impedance amplifiers 352, 354, 356, and 358. Each of the summing trans-impedance amplifiers 352, 354, 356, and 358 is configured to receive and sum two of the phase components of the second IF signal 348 to produce a respective phase component of the quadrature phase IF signal. The summing trans-impedance amplifiers 352, 354, 356, and 358 sum signal currents together on a virtual ground of each amplifier. Each of summing trans-impedance amplifiers 352, 354, 356, and 358 includes a set of resistors, by which weight the phase components is adjusted prior to summing. The weighted summing applied to each of the summing trans-impedance amplifiers can optionally be made reconfigurable by allowing the effective value of the summing resistors at the inputs of the summing trans-impedance amplifiers to be changed.

Figure 4:
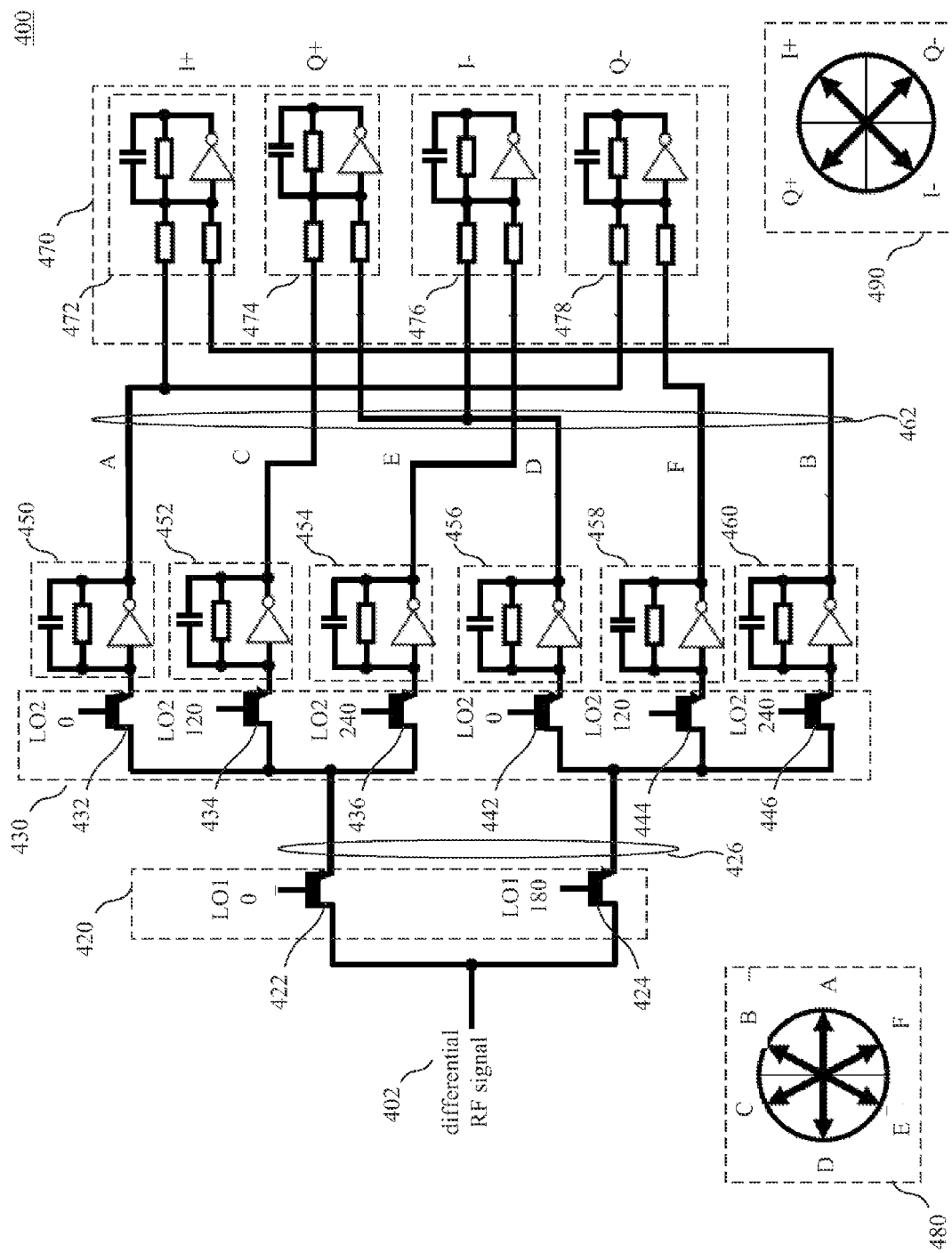
FIG. 4 shows a fourth down-converter circuit, consistent with one or more embodiments.

As previously indicated, in different embodiments, first and second mixing stages may provide IF signals that may include various numbers of phase components. FIG. 4 shows a fourth down-converter circuit, consistent with one or more embodiments. The down-converter includes a first mixer stage 420, a second mixer stage 430, and a set of summing circuits 470, as described with reference to mixer stage 320, mixer stage 330, and set of summing circuits 350 in FIG. 3. In this example, the first mixer stage 420 includes two mixers 422 and 424, each configured to down-convert a respective phase component of a differential RF signal 402 according to a respective phase component of a first LO signal (LO1) to produce a first IF signal 426 having two phase components separated by 180 degrees.

The second mixer stage 430 is configured to further down-convert the first IF signal 426 to generate a second IF signal 462 having three phase components for each phase component of the first IF signal 426. For each phase component of the first IF signal 426, the second mixer stage 430 includes three mixers 432, 434, and 436 or 442, 444, and 446. Each of the mixers 432, 434, 436, 442, 444, and 446 is configured to down-convert a phase component of the first IF signal 426 according to a respective phase component of a second LO signal (LO2) to produce a phase component A, B, C, D, E, or F of the second IF signal 462. Distribution of the phase components A, B, C, D, E, and F of the second IF signal 462 are separated from each other by 60 degrees as shown in constellation diagram 480. In this example, the down-converter circuit 400 includes a set of trans-impedance amplifiers 450, 452, 454, 456, 458, and 460 connected to the second mixer stage 430. Each of the trans-impedance amplifiers 342, 344, and 346 is configured to amplify signals output by the trans-impedance amplifiers to produce the phase components A, B, C, D, E, and F of the second IF signal 462.

The set of summing circuits 470 is configured to combine phase components of the second IF signal to produce phase components I+, Q+, I−, and Q− of a balanced quadrature phase IF signal. The distribution of the phase components I+, Q+, I−, and Q− is shows in phase constellation chart 490. Similar to the set of summing circuits 350 shown in FIG. 3, the set of summing circuits 470 includes four summing trans-impedance amplifiers 472, 474, 476, and 478. Each of the summing trans-impedance amplifiers 472, 474, 476, and 478 is configured to receive and sum two of the phase components of the second IF signal 462 to produce a respective phase component of the quadrature phase IF signal. As described with reference to the set of summing circuits 350, each of the summing trans-impedance amplifiers 472, 474, 476, and 478 includes a set of resistors, which set a weight of the received phased components A, B, C, D, E, and F of the second IF signal 462.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., down-conversion and/or summing). For example, in certain of the above-discussed embodiments, one or more modules are discrete logic circuits or programmable logic circuits configured and arranged for implementing these operations/activities, as in the circuit modules shown in FIGS. 1, 2, 3, and 4. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Based upon the above discussion and illustrations, those skilled in the art will readily recognize that various modifications and changes may be made to the various embodiments without strictly following the exemplary embodiments and applications illustrated and described herein. For example, though aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
a first mixer configured and arranged to down-convert a radio frequency (RF) signal to produce a first intermediate frequency (IF) signal having a first number (M) of phase components;
a second mixer configured and arranged to down-convert the first IF signal to produce a second IF signal having a second number (N) of phase components; and
a plurality of summing circuits, each configured and arranged to combine various ones of phase components of the second IF signal to produce a respective phase component of a third IF signal, the third IF signal having a third number (O) of phase components, wherein N>M and N≠O, wherein the first mixer is configured and arranged to subtract a frequency of a first local oscillator (LO) signal from a frequency of the RF signal to produce a frequency of the first IF signal and the second mixer is configured and arranged to subtract a frequency of a second LO signal from a frequency of the first IF signal to produce a frequency of the second IF signal, the second LO signal has a frequency that is less than a frequency of the first LO signal, wherein the ratio of the frequency of the first LO signal to the frequency of the second LO signal is equal to N/(M*2).

2. The apparatus of claim 1, wherein the frequency of the first LO signal is equal to a product of a frequency of the RF signal multiplied by N/(M*(2+N)).

3. The apparatus of claim 1, wherein the frequency of the second LO signal is equal to the frequency of the first IF signal.

4. The apparatus of claim 1, wherein the frequency of the first LO signal is 3/2 the frequency of the second LO signal.

5. The apparatus of claim 1, wherein M=1, N=3, O=4, and the frequency of the first LO signal is 3/2 the frequency of the second LO signal.

6. The apparatus of claim 1, wherein M=2, N=6, and O=4, and the frequency of the first LO signal is 3/2 the frequency of the second LO signal.

7. The apparatus of claim 1, wherein M=1, N=5, and O=4, and the frequency of the first LO signal is 5/2 the frequency of the second LO signal.

8. The apparatus of claim 1, wherein the first IF signal has a frequency equal to a product of a frequency of the RF signal and (2/(2+N)).

9. The apparatus of claim 1, further comprising a plurality of IF amplifiers, each configured to amplify a respective one of the first number of phase components of the second IF signal.

10. A method for down-converting a radio frequency (RF) signal, the method comprising:

down-converting the RF signal to produce a first intermediate frequency (IF) signal having a first number (M) of phase components;

down-converting the first IF signal to produce a second IF signal having a second number (N) of phase components; and summing various ones of the N phase components of the second IF signal to produce a respective phase component of a third IF signal, the third IF signal having a third number (O) of phase components, wherein N>M and N≠O, wherein the down-converting of the RF signal includes subtracting a frequency of a first local oscillator (LO) signal from a frequency of the RF signal to produce a frequency of the first IF signal, the down-converting of the first IF signal includes subtracting a frequency of a second LO signal from a frequency of the first IF signal to produce a frequency of the second IF signal and the second LO signal has a frequency that is less than a frequency of the first LO signal, wherein the ratio of the frequency of the first LO signal to the frequency of the second LO signal is equal to N/(M*2).

11. The method of claim 10, wherein the frequency of the first LO signal is equal to a product of a frequency of the RF signal multiplied by N/(M*(2+N)).

12. The method of claim 10, wherein the frequency of the second LO signal is equal to the frequency of the first IF signal.

13. The method of claim 10, wherein the frequency of the first LO signal is 3/2 the frequency of the second LO signal.

14. The method of claim 10, werein M=1, N=3, O=4, and the frequency of the first LO signal is 3/2 the frequency of the second LO signal.

15. The method of claim 10, wherein M=2, N=6, and O=4, and the frequency of the first LO signal is 3/2 the frequency of the second LO signal.

16. The method of claim 10, wherein M=1, N=5, and O=4, and the frequency of the first LO signal is 5/2 the frequency of the second LO signal.

* * * * *